US006320365B1

(12) United States Patent
D'Angelo

(10) Patent No.: US 6,320,365 B1
(45) Date of Patent: Nov. 20, 2001

(54) CURRENT-LIMITED SWITCH WITH FAST TRANSIENT RESPONSE

(76) Inventor: Kevin P. D'Angelo, 1516 Homestead Rd., Santa Clara, CA (US) 95060

( * ) Notice: Subject to any disclaimer, the term of this patent is extended or adjusted under 35 U.S.C. 154(b) by 0 days.

(21) Appl. No.: 09/705,053

(22) Filed: Nov. 1, 2000

Related U.S. Application Data

(63) Continuation of application No. 09/502,723, filed on Feb. 11, 2000, now Pat. No. 6,166,530.

(51) Int. Cl.[7] .................................. G05F 3/16; G05F 1/56
(52) U.S. Cl. ......................... 323/316; 323/273; 323/315
(58) Field of Search ..................................... 323/265, 273, 323/312, 314, 315, 316; 330/257, 288

(56) References Cited

U.S. PATENT DOCUMENTS

| 4,319,181 | * | 3/1982 | Wrathall | 323/315 |
|---|---|---|---|---|
| 4,553,084 | * | 11/1985 | Wrathall | 323/316 |
| 4,820,968 | * | 4/1989 | Wrathall | 323/316 |
| 5,285,168 | | 2/1994 | Tomatsu et al. | 330/253 |
| 5,541,799 | * | 7/1996 | Schmidt et al. | 361/18 |
| 5,596,265 | | 1/1997 | Wrathall et al. | 323/315 |
| 5,867,014 | * | 2/1999 | Wrathall et al. | 323/316 |
| 6,002,276 | | 12/1999 | Wu | 327/66 |
| 6,005,378 | | 12/1999 | D'Angelo et al. | 323/313 |
| 6,104,179 | * | 8/2000 | Yukawa | 323/316 |
| 6,211,660 | * | 4/2001 | Iliasevitch | 323/315 |

* cited by examiner

Primary Examiner—Matthew Nguyen

(57) ABSTRACT

A current-limited switch contains a pilot circuit in parallel with a power MOSFET and a reference circuit containing a series of parallel circuits, each of which contains a current mirror MOSFET in parallel with a resistor. A current mirror compensation circuit contains circuitry which shorts out the parallel circuits in sequence as the current through the power MOSFET increases, thereby limiting the size of the current through the power MOSFET. In a preferred embodiment a second MOSFET is used in each parallel circuit in place of the resistor.

7 Claims, 10 Drawing Sheets

CURRENT-LIMITED SWITCH WITH FAST TRANSIENT RESPONSE

This application is a continuation of application Ser. No. 09/502,723, filed Feb. 11, 2000, now U.S. Pat. No. 6,166,530 issued on Dec. 26, 2000.

FIELD OF THE INVENTION

This invention relates to power MOSFET switches and in particular to a power MOSFET switch that has the capability of limiting the current that passes through the switch when the load becomes short-circuited.

BACKGROUND OF THE INVENTION

Power MOSFETs are widely used as switches in a variety of applications, including laptop computers, cellular phones and the like. Many of these products have internal circuit elements that are very sensitive to overcurrent conditions. If one element in the circuit becomes short-circuited, the resulting increase in current through the circuit may damage or destroy remaining elements in the circuit. For example, in a computer Universal Serial Bus (USB) application, there is a risk that if the user short-circuits the USB port the short-circuit will propagate back through the computer and damage other systems within the computer. It is therefore desirable to provide the MOSFET switch with a current-limiting capability that senses an overcurrent condition and closes the switch sufficiently that the current does not reach levels that will damage any of the internal components of the product.

Ideally, a MOSFET switch would have a very low on-resistance and would respond very quickly to an overcurrent condition by limiting the short-circuit current to a predetermined level. Such a switch would be highly efficient as a power supply and would protect upstream systems from short-circuit damage. The response time is particularly important because the longer the circuit is exposed to the overcurrent condition, the greater the likelihood of damage. The systems to be protected must inevitably be overdesigned to some extent to withstand the current pulse that occurs before the current-limiting circuitry is able to operate, and this leads to extra cost and weight. A fast response time in effect minimizes the amount of overdesign necessary.

In many current-detection circuits a "pilot" circuit is connected in parallel with the circuit to be monitored, and the current through the pilot circuit is detected. Such a prior art circuit is shown in FIG. 1. The current through power MOSFET 10 (Iout) is mirrored by the current through pilot MOSFET 18. A pilot resistor 26 is connected in the pilot circuit. The gate width of power MOSFET 10 is much larger than the gate width of pilot MOSFET 18, the ratio of the gate widths being defined as "m" or as the scaling factor "SF" (m=SF). For example, if m=100, the impedance of MOSFET 18 is 100 times the impedance of MOSFET 10, and the current through power MOSFET 10 should be 100 times the size of the current through pilot MOSFET 18. Ideally, this ratio should remain the same regardless of the size Iout, in which case the current through pilot MOSFET 18 accurately mirrors the current through power MOSFET 10.

A reference current (Iref) is supplied through a reference resistor 30, which is substantially equal to resistor 26. A comparator 32 detects the difference between the voltage drops across pilot resistor 26 and reference resistor 30, and when the voltage drops are equal comparator 32 delivers an output signal.

Iref$^2$R30 represents wasted energy (R30 representing the size of resistor 30), so it is desirable to increase the size of resistor 30 and reduce the size of Iref. For example, if R30 is doubled, Iref can be reduced by one-half while obtaining the same voltage drop across resistor 30. This requires, however, that the size of resistor 26 also be doubled, since R26≈R30. Increasing the size of resistor 26 (R26) increases the nonlinearity of the circuit, since the ratio of the currents through power MOSFET 10 and pilot MOSFET 18 becomes less constant as resistor 26 becomes larger. The current through the pilot MOSFET 18 thus becomes a less accurate "mirror" of the current through power MOSFET 10.

The circuit shown in FIG. 1 is discussed more fully in U.S. Pat. No. 5,867,014 to Wrathall et al., incorporated herein in its entirety.

This nonlinearity can be overcome by connecting a reference MOSFET 34, equal in size to pilot MOSFET 18, in parallel with resistor 30 and by driving the gate of reference MOSFET 34 in common with the gates of power MOSFET 10 and pilot MOSFET 18, as shown in FIG. 2. This arrangement provides an Iref that is equal to the current that would flow in the pilot circuit if resistor 26 were not present and proportional to the current through the power MOSFET 10. Thus the ratio of the current through power MOSFET 10 to Iref is equal to the scaling factor (SF or m) and remains constant regardless of the size of the current through power MOSFET 10. This allows large resistors to be used for pilot resistor 26 and reference resistor 30 without adversely affecting the linearity of the circuit. The circuit shown in FIG. 2 is explained more fully in U.S. Pat. No. 4,820,968 to Wrathall et al., incorporated herein in its entirety.

Nonetheless, the limitations of transistor fabrication techniques limit the size of the scaling factor (the ratio of the gate widths of power MOSFET 10 and pilot MOSFET 18), and therefore the size of Iref may still be larger than would be desirable to minimize energy losses. As is apparent from FIG. 2, Iref flows at all times, regardless of the state of power MOSFET 10.

A solution to this problem is shown in FIG. 3, which represents the teaching of the above-referenced U.S. Pat. No. 5,867,014. Four reference MOSFETs 62, 64, 66 and 68 are connected in the reference circuitry. Each reference MOSFET is connected in parallel with a different reference resistor 70, 72, 74 and 76. The circuit is similar to the circuit of FIG. 2 except that four parallel MOSFET-resistor combinations similar to the parallel combination of MOSFET 34—resistor 30 are connected in series. Each of MOSFETs 62, 64, 66 and 68 has electrical characteristics substantially similar to those of pilot MOSFET 54. Thus, if the gate width of pilot MOSFET 54 is related to the gate width of power MOSFET 40 by the scaling factor SF=m, the gate width of each of MOSFETs 62, 64, 66 and 68 is also related to gate width of power MOSFET 40 by the factor m. Each of reference resistors 70, 72, 74 and 76 has an impedance equal to the impedance of pilot resistor 58. The factor "n" represents the number of reference MOSFETs (i.e., in this case n=4).

It can be shown that, in the embodiment of FIG. 3:

$$Iout = Iref \cdot m \cdot n$$

Thus, for a given value of Iout, the size of Iref can be reduced by a factor of four in the circuit of FIG. 3 as compared with the circuit of FIG. 2.

The circuit of FIG. 3 functions as a current detector but only when power MOSFET 40 is operating in its linear region.

A prior art circuit for limiting the load current in the event of a short-circuit is shown in FIG. 4. The current through pilot MOSFET 82 is a predetermined percentage of the current through power MOSFET 80. When there is no load current Iout, amplifier 88 biases MOSFET 90 off, and there is no current through the resistor Rset. When Iout increases as a result of a short in the load, the output of amplifier 88 controls MOSFET 90 so that MOSFET 90 gradually conducts more current. As MOSFET 90 begins to conduct, the current replica voltage SET increases and is delivered to the (+) input terminal of the current limit amplifier 86. When the voltage SET exceeds an internal voltage Vref, the output of amplifier 86 reduces the current through power MOSFET 80 and MOSFET 82. Because the feedback loop in this circuit contains two amplifiers, its response time to a short-circuit condition is rather slow. Moreover, the circuit does not limit Iout when the drain voltages of MOSFETS 80 and 82 (i.e., Vout) fall below Vref (about 1.2 V). When this point is reached, further decreases in Vout do not change the output of amplifier 86. Since the gate voltages of MOSFETs 80 and 82 are therefore fixed, the drain to source voltages of MOSFETs 80 and 82 diverge, allowing Iout to increase.

Yet another current-limiting circuit is taught in U.S. Pat. No. 5,541,799, but again it does not limit the transient current sufficiently to protect the components of the circuit.

Thus there exists a real need for a current limiting circuit that has a fast response time and that operates effectively when a short-circuit condition drives the power MOSFET outside of its linear region.

SUMMARY OF THE INVENTION

A current-limited switch according to this invention comprises a power MOSFET, a pilot circuit, a reference circuit and a difference amplifier. The pilot circuit is connected in parallel with the power MOSFET, and a pilot MOSFET and a pilot resistor are connected in the pilot circuit. The reference circuit comprises a current source and current mirror circuitry, the current mirror circuitry comprising at least first and second parallel circuits, each parallel circuit comprising a current mirror MOSFET connected in parallel with a resistor. The first and second parallel circuits are connected in series.

The difference amplifier has a first input terminal coupled to a point in the pilot circuit, a second terminal coupled to a point in the reference circuit, and an output terminal coupled to a gate of the power MOSFET.

Importantly, the current-limited switch comprises a current mirror compensation circuit which includes a first bypass switch for forming a short around the first parallel circuit when a voltage at a terminal of the power MOSFET reaches a first level. Since Iout=m·n·Iref, where n represents the number of parallel circuits, shorting out one of the parallel circuits reduces Iout. This prevents the current through the power MOSFET from increasing linearly as the voltage at one of the terminals of the power MOSFET falls (or increases) as a result of a short-circuit.

The current mirror compensation circuit may comprise a second bypass switch for forming a short around the second parallel circuit when the voltage at the terminal of the power MOSFET reaches a second level. Again this reduces the factor n and prevents Iout from increasing. The current mirror circuitry may contain more than two parallel circuits and the current mirror compensation circuit may contain more than two bypass switches.

The current mirror compensation circuit may also contain a voltage divider circuit for controlling the bypass switches, a first node of the voltage divider circuit being coupled to the first bypass switch and a second node of the voltage-divider circuit being coupled to the second bypass switch.

In a preferred embodiment of this invention, a second MOSFET is used instead of a resistor in each of the parallel circuits. Furthermore, a second pilot MOSFET may be used instead of a resistor in the pilot circuit. A MOSFET takes up less area on the chip than a resistor. Moreover, unlike a resistor a MOSFET can be turned off, thereby allowing power to be conserved when the current-limited switch is turned off.

According to another aspect, this invention includes a method of limiting a current through a power MOSFET. The method comprises connecting a pilot circuit in parallel with the power MOSFET, a pilot MOSFET and a pilot resistor being included in the pilot circuit; forming a reference circuit comprising current mirror circuitry, the current mirror circuitry comprising a series of parallel circuits, each parallel circuit comprising a current mirror MOSFET connected in parallel with a resistor; providing a difference amplifier; coupling a first input terminal of the difference amplifier to a point in the pilot circuit and a second input terminal of the difference amplifier to a point in the reference circuit; coupling an output terminal of the difference amplifier to a gate of the power MOSFET; and shorting out a first one of the parallel circuits when a current through the power MOSFET reaches a first level.

In a preferred method, a second MOSFET is used instead of a resistor in each of the parallel circuits.

BRIEF DESCRIPTION OF THE DRAWINGS

The invention will be best understood by reference to the following drawings, in which similar elements are identified by like reference numerals.

DESCRIPTION OF THE INVENTION

Figure 1:
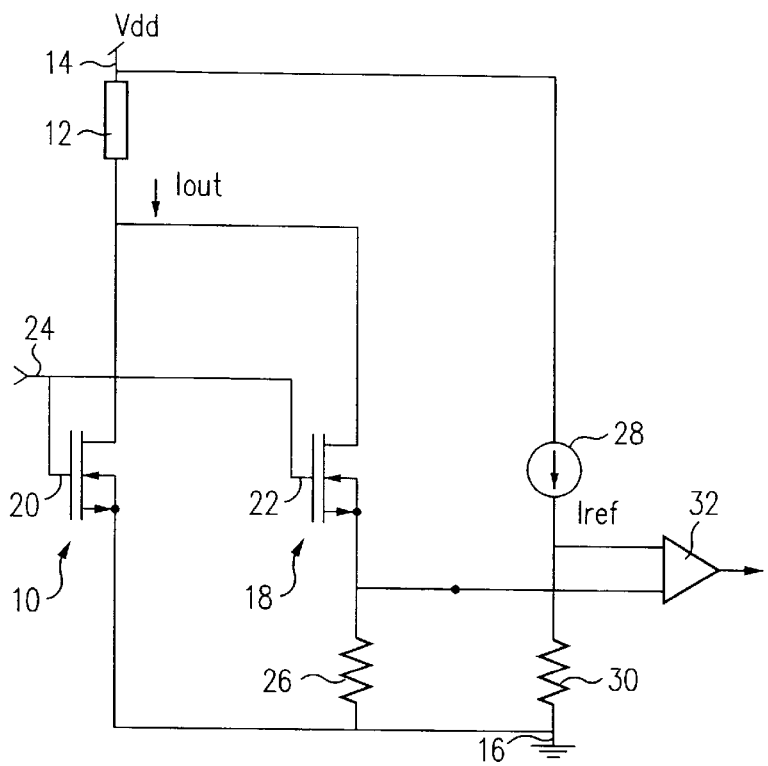
FIG. 1 is a schematic circuit diagram of a first prior art current-detector circuit wherein the reference circuit contains a resistor.
Figure 2:
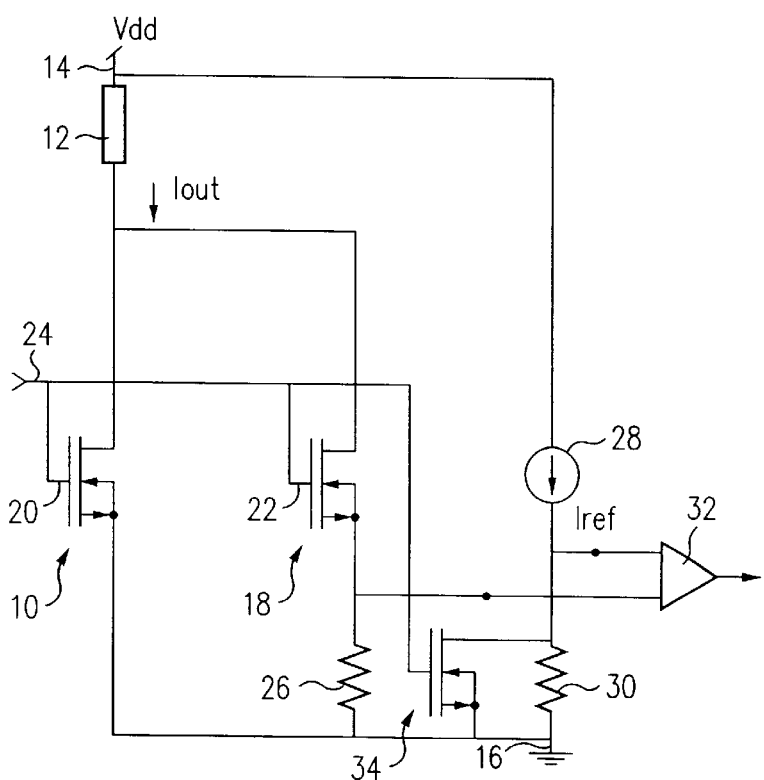
FIG. 2 is a schematic circuit diagram of a second prior art current-detector circuit wherein the reference circuit contains a MOSFET connected in parallel with a resistor.
Figure 3:
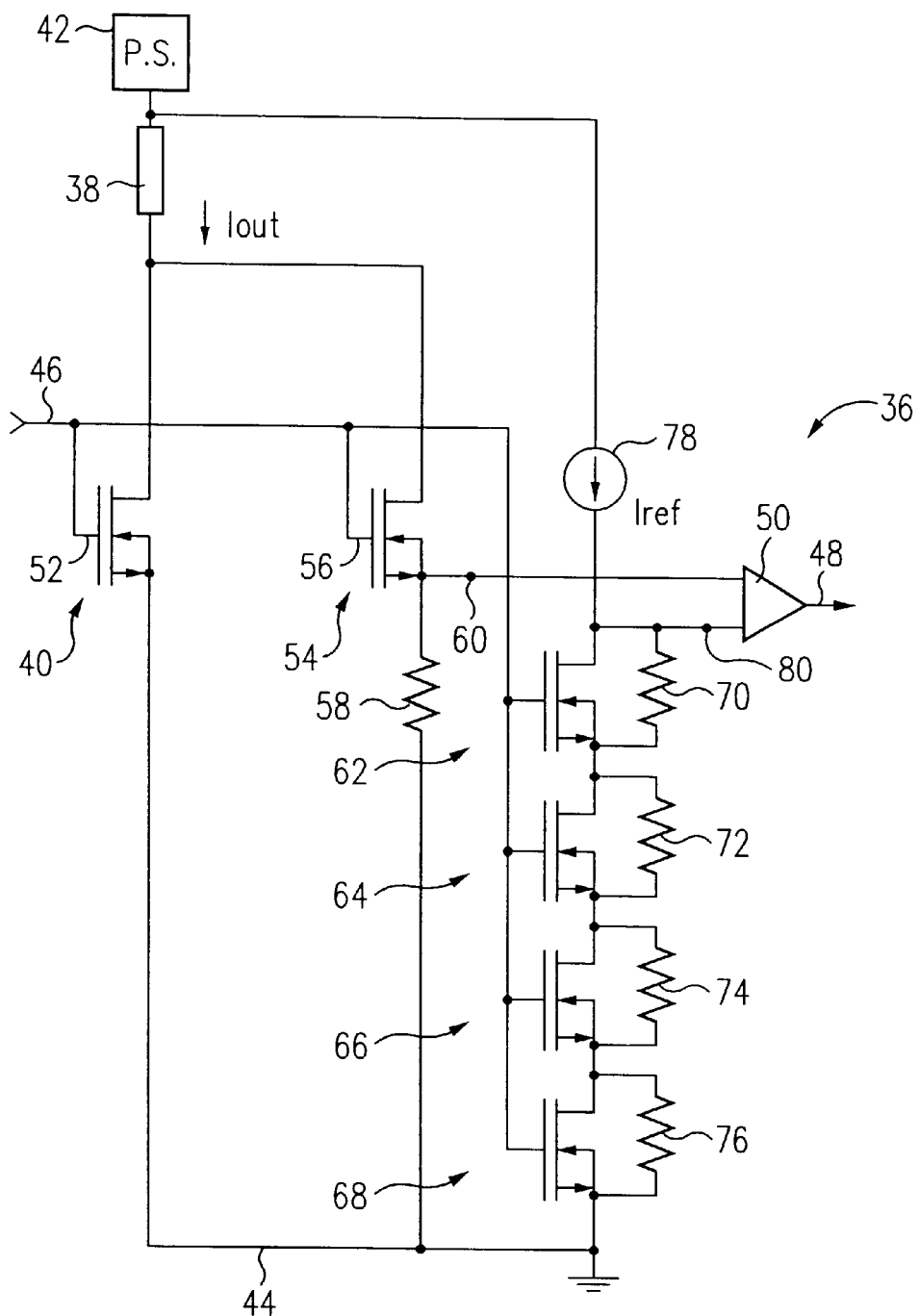
FIG. 3 is a schematic circuit diagram of a third prior art current-detector circuit wherein the reference circuit contains a series of parallel circuits, each parallel circuit containing a MOSFET connected in parallel with a resistor.
Figure 4:
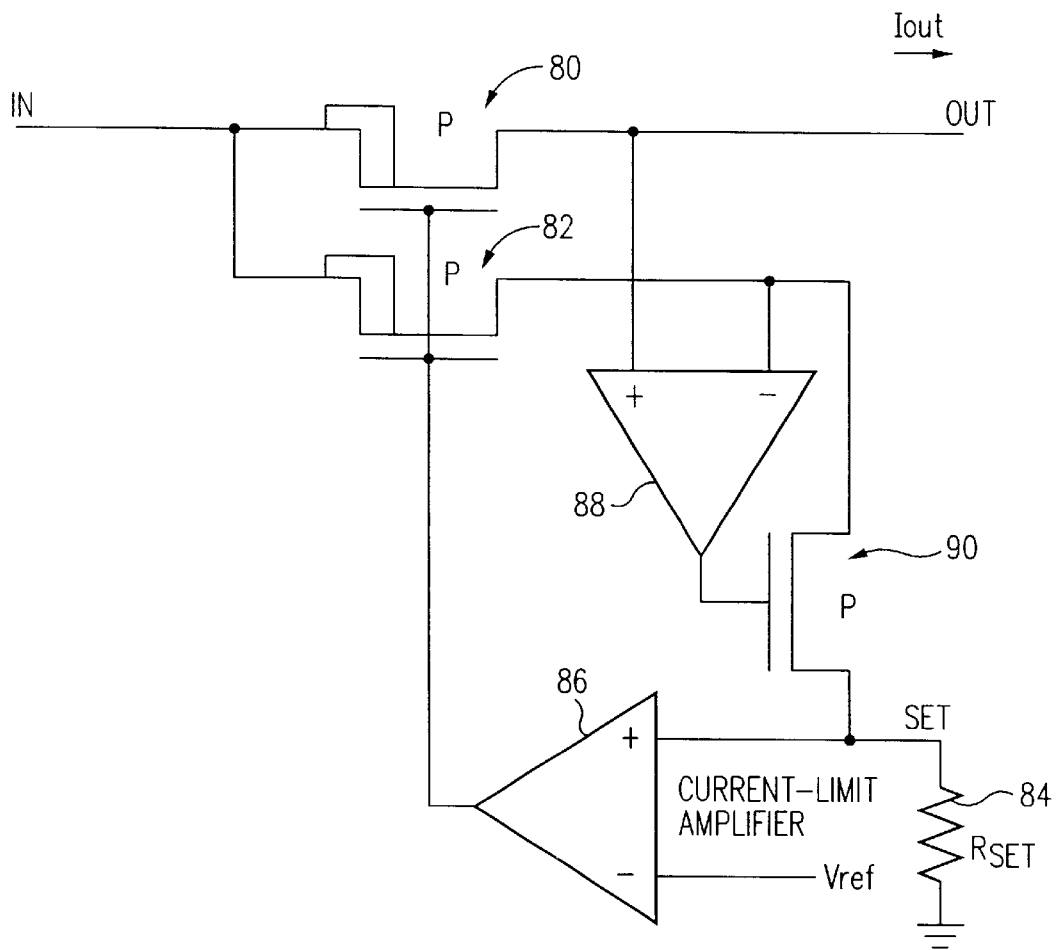
FIG. 4 is a schematic circuit diagram of a prior art current-limited switch containing two amplifiers.
Figure 5:
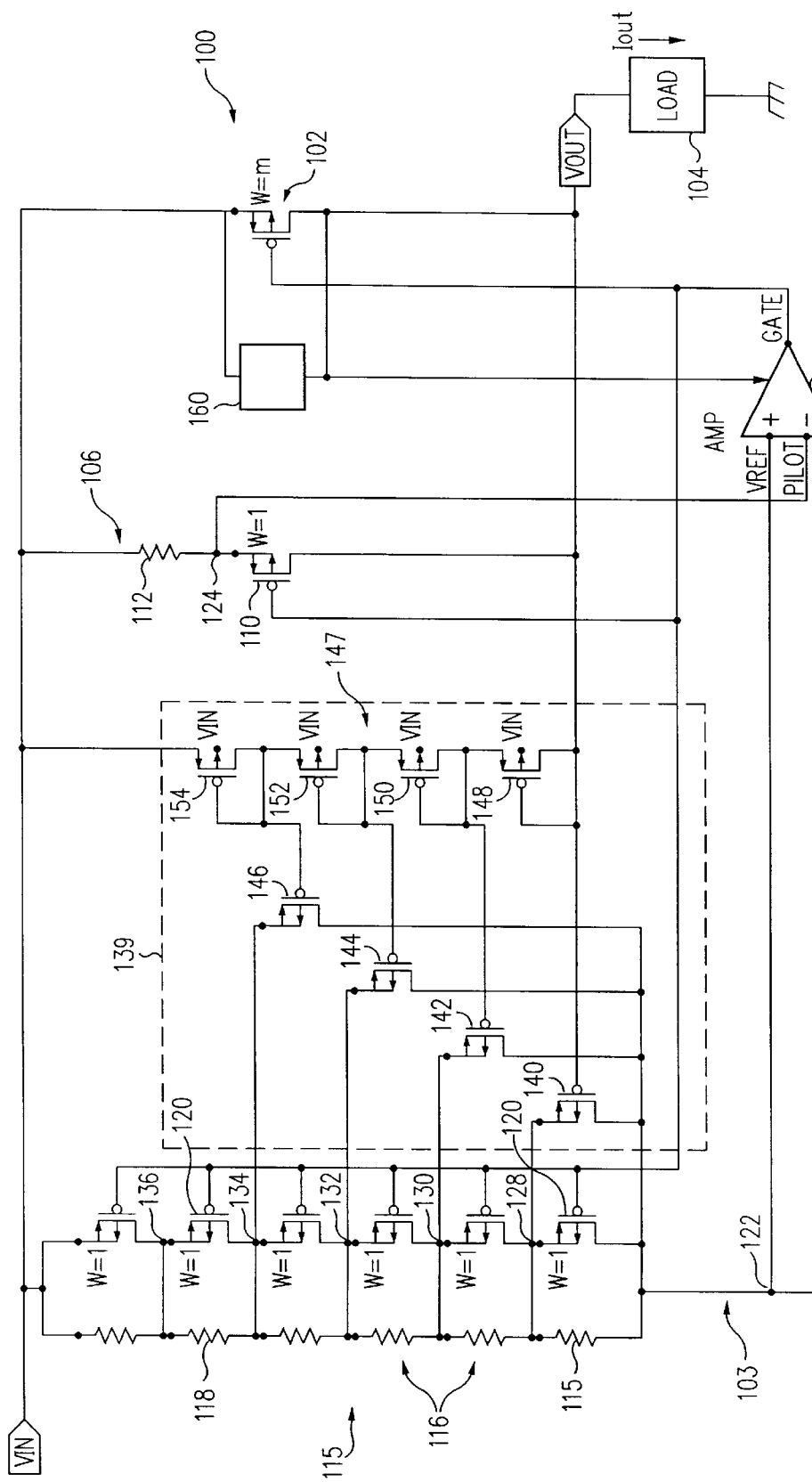
FIG. 5 is a schematic circuit diagram of a first embodiment according to this invention containing a current mirror compensation circuit and wherein each parallel circuit contains a current mirror MOSFET in parallel with a resistor.

FIG. 5 shows a first embodiment of a current-limited switch 100 according to the invention. Switch 100 includes a power MOSFET 102 that is connected between a supply voltage Vin and a load 104. Power MOSFET 102 supplies a voltage Vout to load 104. As will be apparent, Vin very nearly equals Vout when power MOSFET 102 is turned on, assuming that the on-resistance of power MOSFET 102 is low. As described above, current-limited switch 100 is designed to limit the current when a short-circuit occurs within load 104 to protect the other components of load 104 and any circuit elements that might be located upstream from switch 100.

Switch 100 includes a pilot circuit 106 that is connected in parallel with power MOSFET 102 and a reference circuit 108 that is connected between Vin and ground. Pilot circuit 106 contains a pilot MOSFET 110 and a pilot resistor 112. As indicated, the gate width of pilot MOSFET 110 is smaller than the gate width of power MOSFET 102 by a factor m. Therefore, the current through pilot circuit 106 is generally equal to 1/m times the current through power MOSFET 102, although as described above this is not exactly correct because of the presence of pilot resistor 104. As the current through pilot circuit 106 increases the voltage drop across pilot resistor 112 also increases and this creates a nonlinearity in the relationship between the currents in power MOSFET 102 and pilot circuit 106.

Reference circuit 108 contains a constant current source 109 and current mirror circuitry 115. Current mirror circuitry 115 contains a series of parallel circuits 116, each of which contains a parallel combination of a current mirror MOSFET 120 and a resistor 118. Each of current mirror MOSFETs 120 has electrical characteristics similar to those of pilot MOSFET 110, and each of resistors 118 has an impedance identical to the impedance of pilot resistor 112. Nodes 128, 130, 132, 134 and 136 represent the points between parallel circuits 116.

Switch 100 also contains a difference amplifier 114. The (+) input terminal (PILOT) of amplifier 114 is connected to a node 124 between pilot MOSFET 110 and pilot resistor 112 in pilot circuit 106, and the (−) input terminal (Vref) of amplifier 114 is connected to a node 122 at one end of current mirror 115 in reference circuit 108. When power MOSFET switch 102 is turned on, the output terminal of amplifier 114 is connected to the gate terminal of power MOSFET 102. As described below, to conserve power, amplifier 114 and the rest of the circuitry in current-limited switch 100 are disabled by a "crude" current-detection circuit 160 when the current through power MOSFET 102 is below a predetermined minimal threshold level (e.g., 15–20% of the current limit).

As described in U.S. Pat. No. 5,867,014, with this structure the current Iref in reference circuit 108 is related to the current Iout through load 104 as follows:

$$Iout = Iref \cdot m \cdot n$$

where m is the ratio between the size of pilot MOSFET 110 and the size of power MOSFET 102 and n is the ratio between the number of parallel circuits 116 and the number of pilot resistors 112. In this embodiment N=6.

In operation, switch 100 contains a feedback loop wherein the output of amplifier 114 is used to control the gates of power MOSFET 102 and pilot MOSFET 110. For example, if there is a short-circuit in load 104 Vout decreases, increasing the current through power MOSFET 102 and the much smaller current through pilot circuit 106. The voltage (PILOT) at node 114 falls, increasing the difference between Vref and the voltage (PILOT), and the output of amplifier increases, biasing the gate of power MOSFET 102 so as to reduce Iout. The rise in the output voltage of amplifier 114 is also applied to the gate of pilot MOSFET 110, reducing the size of the current in pilot circuit 106.

Current-limited switch 100 is turned off by disabling amplifier 114 and disconnecting the gate of power MOSFET 102 from the output terminal of amplifier 114 and connecting its gate to its source using a MOSFET or other switch (not shown). Amplifier 114 can be disabled in the manner described below in connection with the current-detection circuit shown in FIG. 10.

Figure 6A:
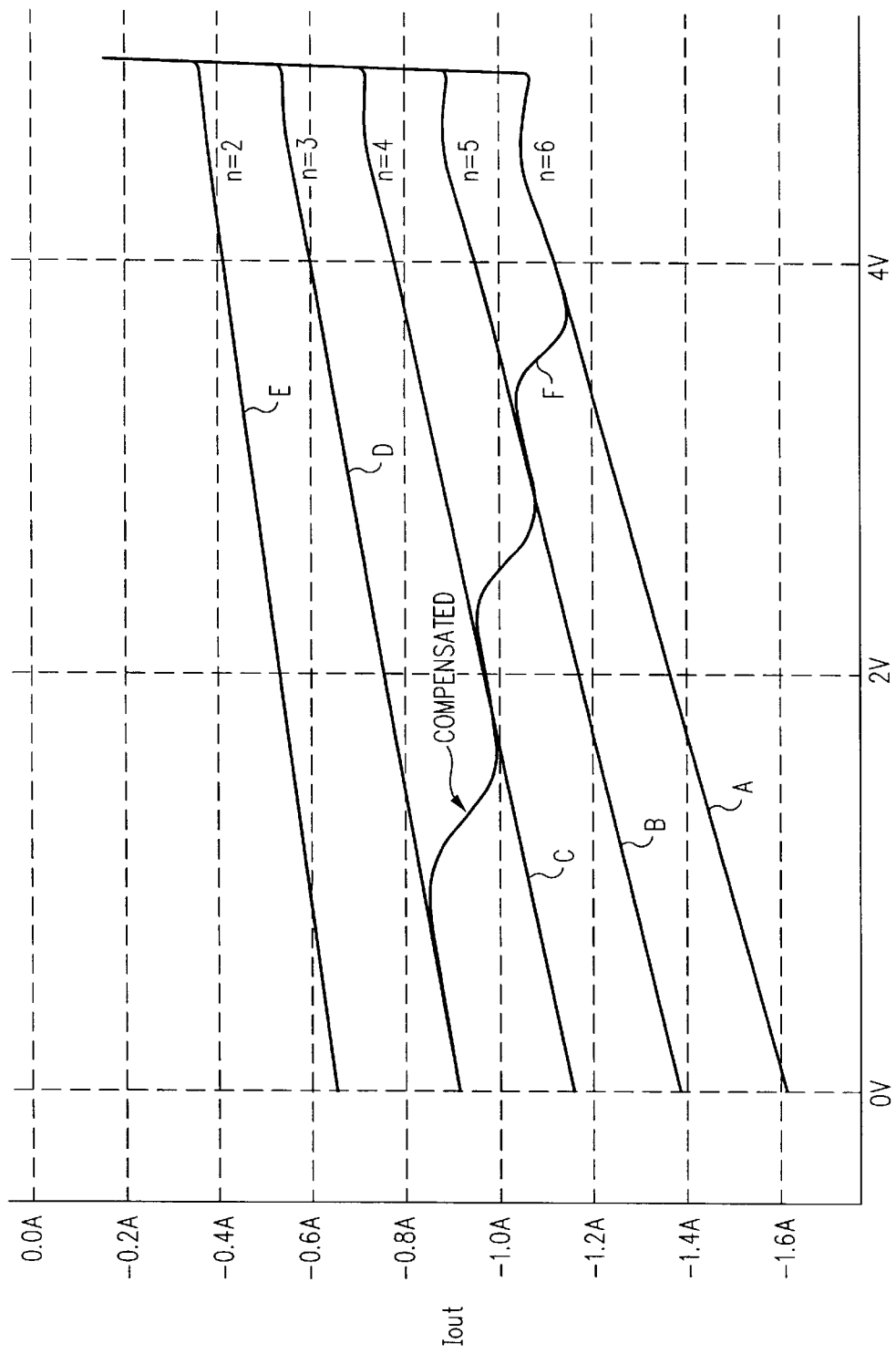
FIGS. 6A and 6B are graphs of output current versus output voltage for current-limited switches.

This arrangement works well so long as Vout is within a threshold voltage of Vin. If Vout continues to decrease beyond Vin-Vt, Iout increases linearly. This is shown in FIG. 6A, which is a graph of Iout versus Vout. Curve A shows Iout versus Vout when the number of parallel circuits 116 (n) equals 6. Vout starts at about 5 V and, when a short-circuit occurs, Iout stabilizes initially at a little over 1.0 A (note that the direction of current through load 104 to ground is considered negative). At about 4.5 V, however Iout starts to increase (in a negative direction) and it reaches about 1.6 A if there is a complete short across load 104 (Vout=0). As described above, this increase in Iout from 1.0 A to 1.6 A requires that the elements in load 104 (or other circuit elements upstream from switch 100) be designed more robustly than if Iout could be limited to 1.0 A.

Returning to FIG. 5, in accordance with this invention, switch 100 includes a current mirror compensation circuit 139. Circuit 139 includes a number of bypass switches in the form of MOSFETs 140, 142, 144 and 146 that are connected in parallel with parallel circuits 116. In this embodiment, MOSFET 140 is connected between nodes 122 and 128, MOSFET 142 is connected between nodes 122 and 130, MOSFET 144 is connected between nodes 122 and 132, and MOSFET 146 is connected between nodes 122 and 134.

Current mirror compensation circuit also includes a voltage divider circuit 147, which comprises serially connected MOSFETs 148, 150, 152 and 154. The drain and gate terminals of each of MOSFETs 148, 150, 152 and 154 are shorted together, and the body (substrate) of each MOSFET is connected to Vin. Thus the source-drain voltage across each of MOSFETs 148, 150, 152 and 154 is approximately equal to a threshold voltage drop.

The gate terminal of MOSFET 140 is connected to the drain terminal of power MOSFET 102. Thus when Vout reaches a threshold drop below node 128, MOSFET 140 turns on, shorting out the first parallel circuit 116. Since the gate terminal of MOSFET 142 is a voltage drop above the gate terminal of MOSFET 140, MOSFET 142 turns on when Vout falls another threshold drop, shorting out the second parallel circuit 116. Similarly, MOSFETs 144 and 146 turn on in succession as Vout continues to fall.

The net effect is illustrated in FIG. 6A. The family of curves A, B, C, D and E show Iout for values of n equal to 6, 5, 4, 3 and 2, respectively. Shorting out parallel circuits 116 in succession has the effect of reducing n in stages from 6 to 2. In effect, Iout "jumps" from one curve to the next as n is reduced. The curve labeled F shows the resultant compensated Iout as Vout falls from 5 V to 0 V. While there are some ripples in curve F, Iout remains constant within a factor of ±10% and in fact ends up at a level less than 1.0 A when Vout equals 0 V.

Figure 6B:
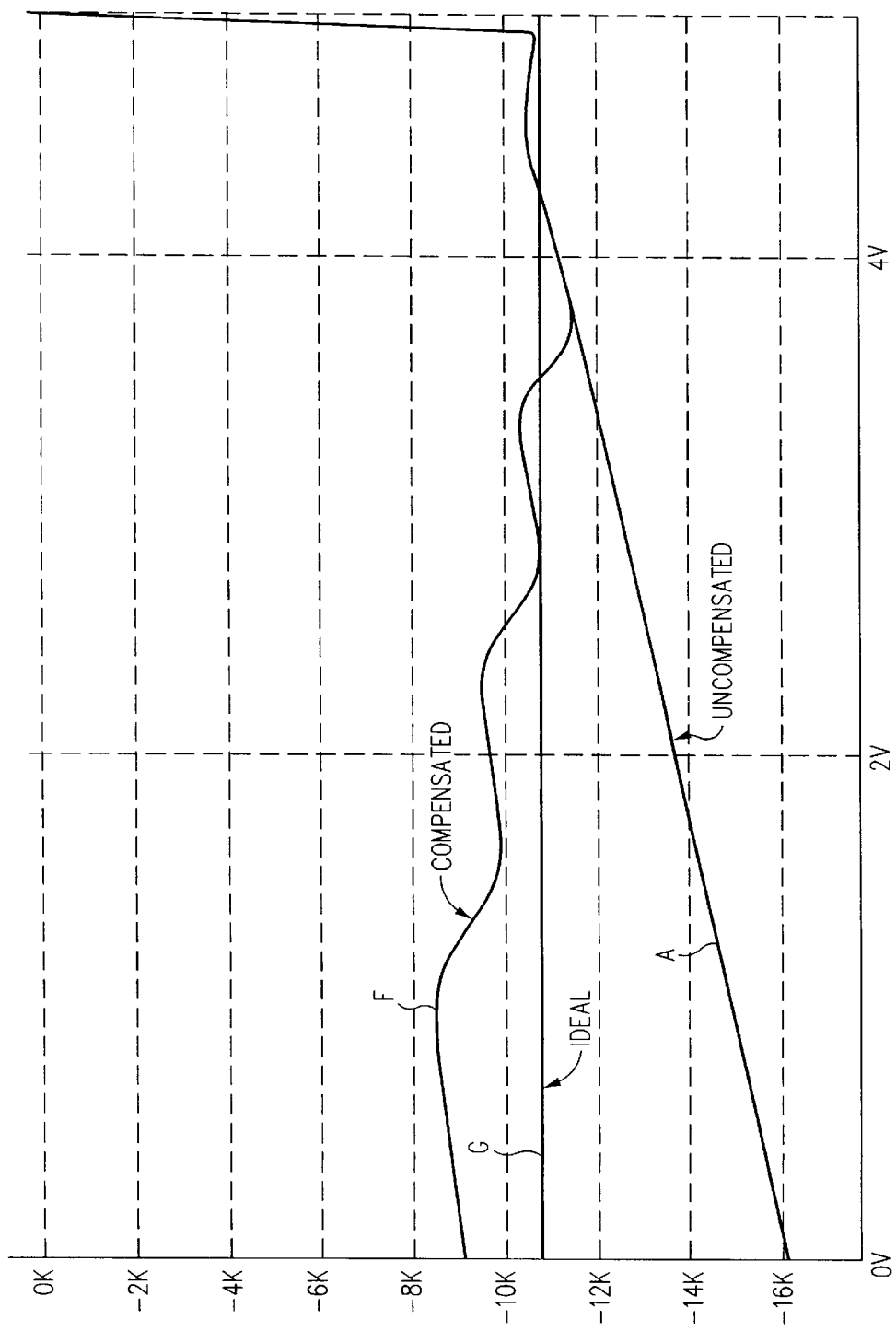

The graph of FIG. 6B shows a comparison of the compensated current (curve F), the uncompensated current (curve A), and the ideal constant current (curve G) where Iout=Iref·m·n.

While all of the MOSFETs in switch 100 are P-channel, alternative embodiments (e.g., for use as low-side switches) can be made with N-channel MOSFETs.

The current mirror compensation circuit 139 shown S in FIG. 5 can be constructed in numerous other ways to sequentially turn on the bypass switches represented by MOSFETs 128, 130, 132, 134 and 136 so as to short out parallel circuits 116 in sequence, thereby reducing the value of "n". For example, resistors might be used in place of MOSFETs 148, 150, 152 and 154.

Figure 7:
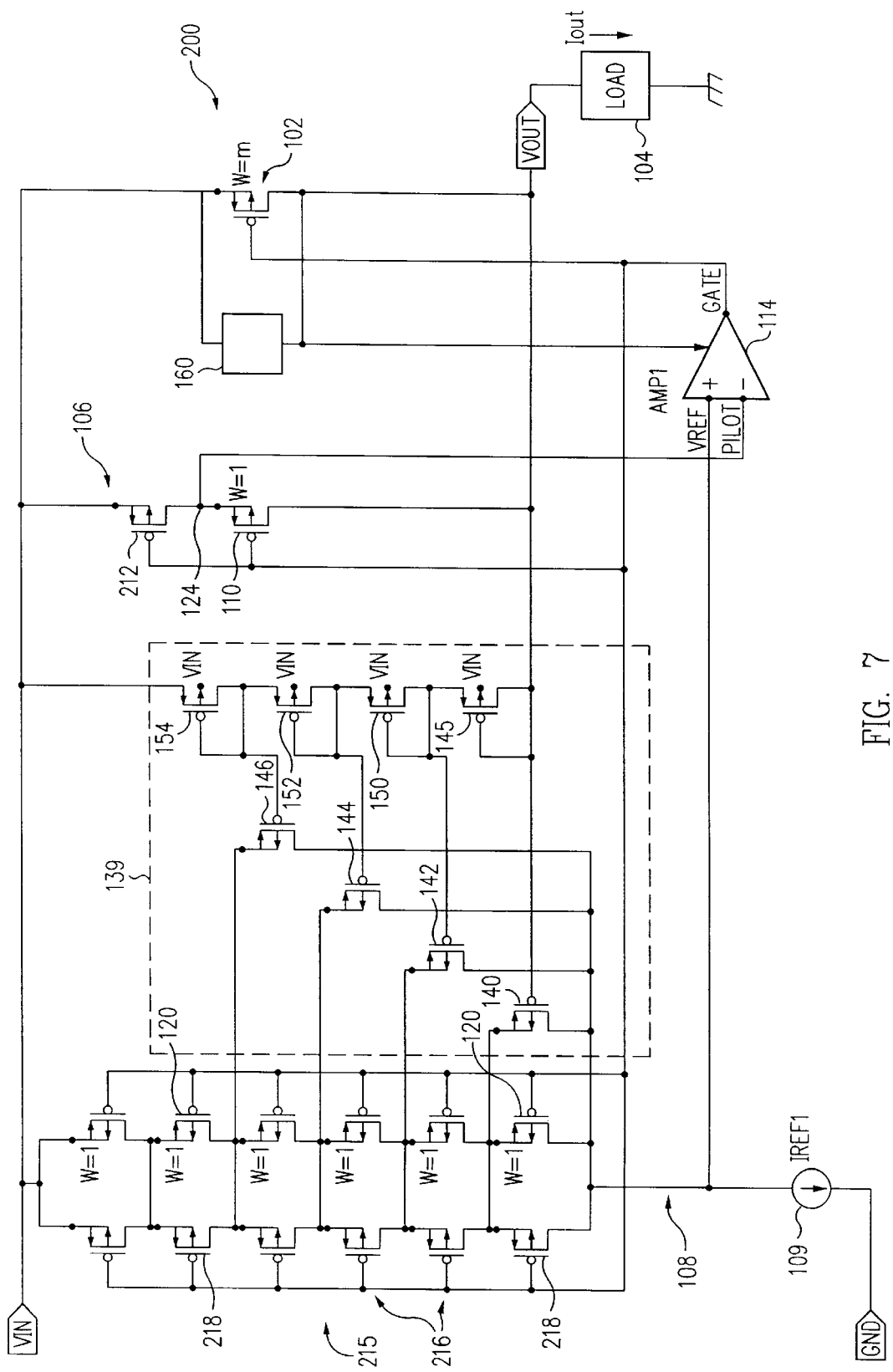
FIG. 7 is a schematic circuit diagram of a second, preferred embodiment according to this invention wherein each parallel circuit contains a current mirror MOSFET and a second MOSFET.

FIG. 7 shows another embodiment of the invention that is substantially superior to the embodiment of FIG. 5. In current-limited switch 200, a MOSFET 212 has been used instead of resistor 112 in pilot circuit 106, and a MOSFET 218 has been used instead of resistor 118 in each of the parallel circuits 216. The gate terminals of MOSFETs 212 and 218 are connected to the output terminal of difference amplifier 114. MOSFETs 212 and 218 are fabricated such that their channel length is typically 2 or 3 times the channel (gate) width.

The use of MOSFETs instead of resistors greatly reduces the area required for the current-limited switch on an IC chip. Moreover, unlike resistors, MOSFETs can be turned off, thereby allowing the pilot and reference circuits to be shut down completely when the power MOSFET 102 is turned off. Finally, resistors are very difficult to obtain unless the fabrication process provides a well-matched high sheet rho resistor. Standard CMOS processes do not have this capability.

Figure 8:
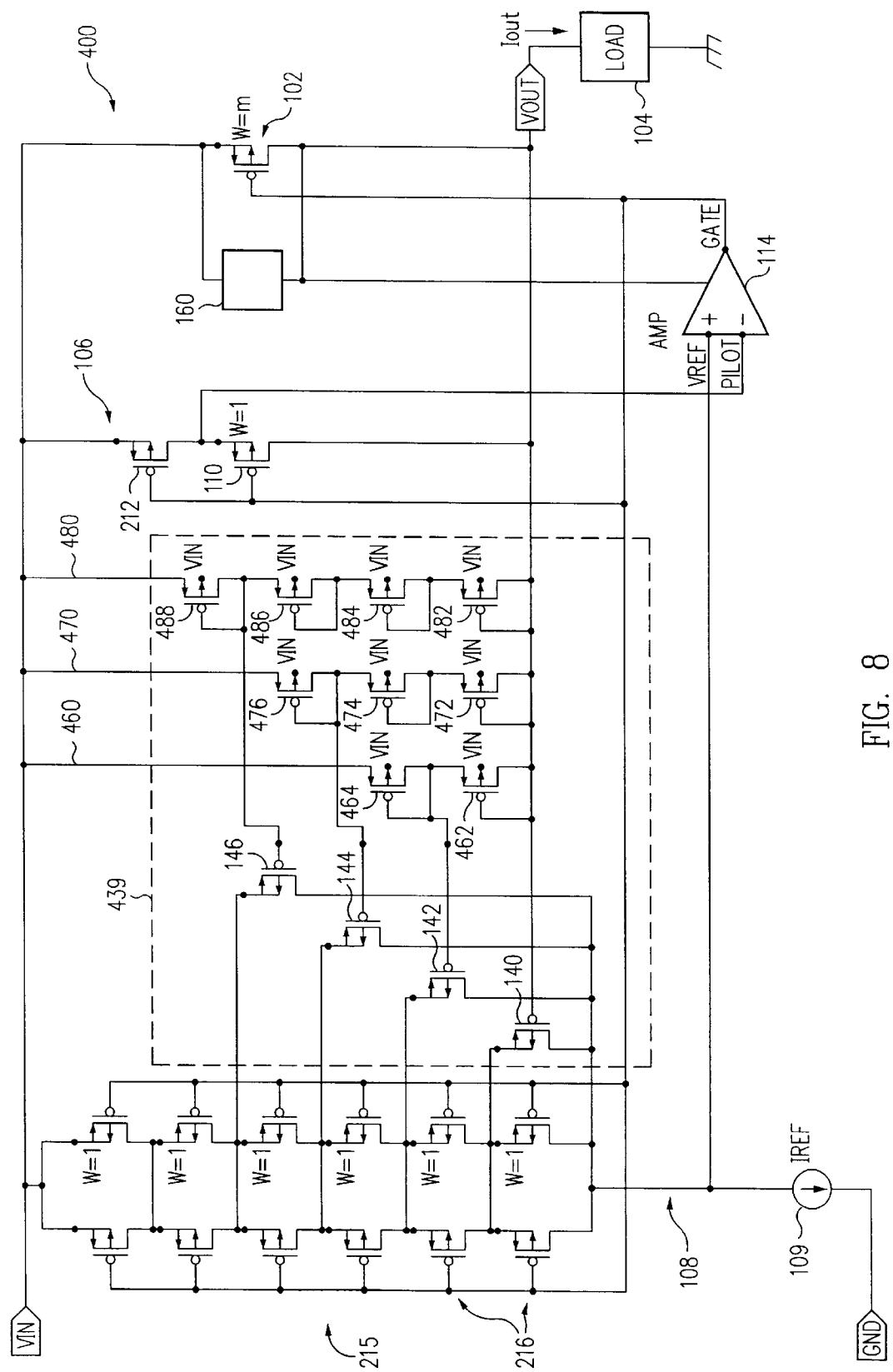
FIG. 8 is an alternative version of the embodiment shown in FIG. 7.

FIG. 8 shows an improved version of current-limited switch 200 shown in FIG. 7. Current-limited switch 400 is similar to switch 200, except that current mirror compensation circuit 439 has been substituted for circuit 139. In circuit 439, and in particular the voltage divider portion thereof, the series of MOSFETs 148, 150, 152 and 154, has been replaced by three parallel circuits 460, 470 and 480. As shown, the node between MOSFETs 462 and 464 is tied to the gate of bypass MOSFET 142; the node between MOSFETS 474 and 476 is tied to the gate of bypass MOSFET 144; and the node between MOSFETs 486 and 488 is tied to the gate of bypass MOSFET 146. As in circuit 139, the gate of bypass MOSFET 140 is connected to the drain of power MOSFET 102. As Vout falls in a short-circuit condition, MOSFETs 140, 142, 144 and 146 are turned on in sequence, shorting out the parallel circuits 216 in sequence.

The parallel arrangement of circuits 460, 470 and 480 exhibits somewhat less impedance than the series arrangement of MOSFETs 148, 150, 152 and 154, and thus less time is required to turn off the gates of MOSFETs 140, 142, 144 and 146.

Figure 9:
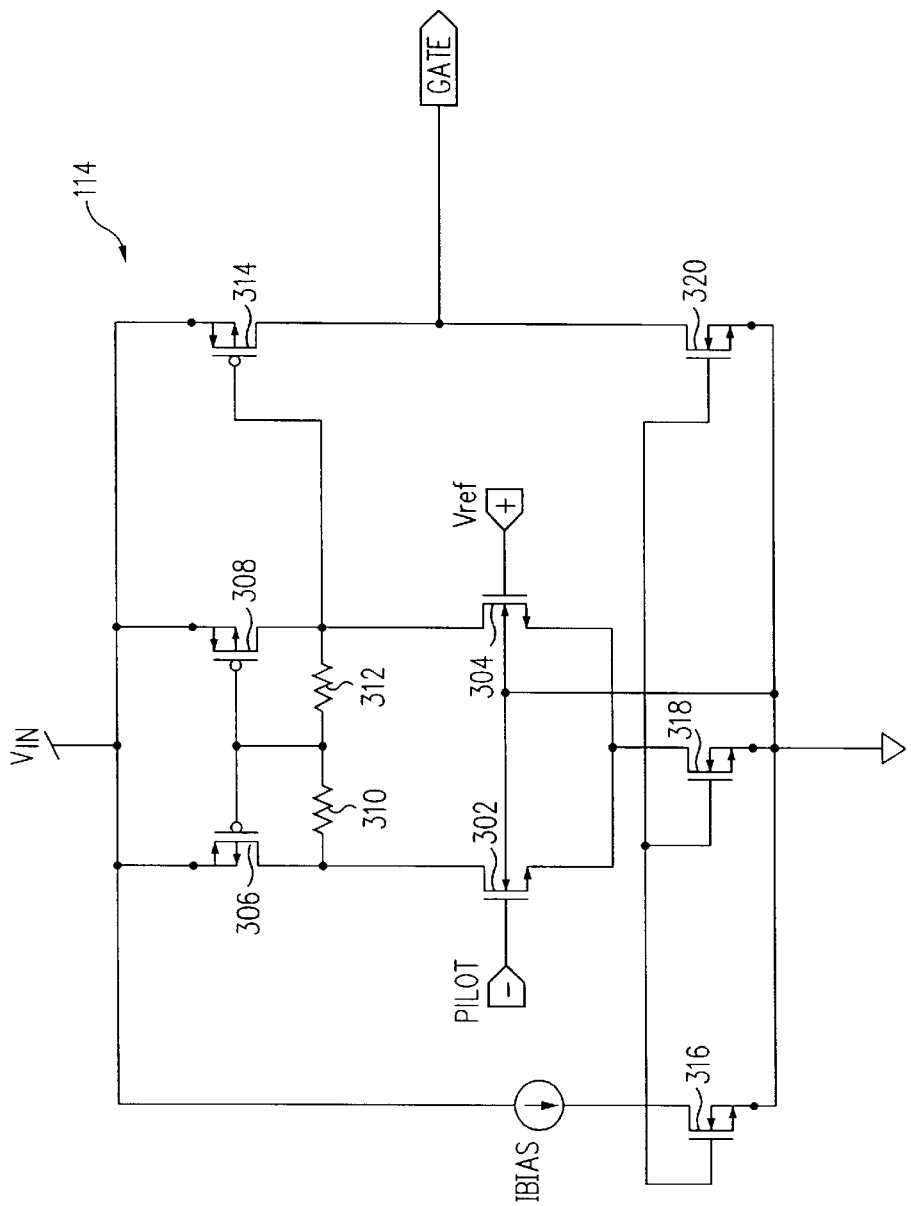
FIG. 9 is a schematic circuit diagram of a difference amplifier useful in the current-limited switch.

FIG. 9 shows a schematic circuit diagram of one embodiment of difference amplifier 114 that can be designed to supply several milliamps of gate drive current to the gate of power MOSFET 102 during a short-circuit condition in load 104. N-channel MOSFETs 316, 318 and 320 serve as current sources.

Amplifier 114 is two-stage Class A amplifier, with a differential pair consisting of N-channel MOSFETS 302 and 304 driving an output stage which includes a P-channel MOSFET 314. The gate terminals of MOSFETs 302 and 304 are connected to PILOT and Vref, respectively. Resistors 310 and 312 are gain reducing resistors that help to ensure adequate stability. The gain of the differential pair 302, 304 is the product of the transconductance gm of N-channel MOSFET 302 and the parallel combination of the three resistances involved: the drain to source resistance (rds) of MOSFETs 302 and 306 and the resistance of resistor 310, or gm(302)*rds(302)//rds(306)//R(310), where "//" signifies "in parallel with", and R1//R2=(R1*R2)/(R1+R2) and R1//R2//R3=(R1*R2*R3)/((R1*R2)+(R2*R3)+(R1*R3)). The gain of the output stage is the product of the transconductance gm of P-channel MOSFET 314 and the parallel combination of the drain to source resistances of MOSFETs 314 and 320, or gm(314)*rds(314)//rds(320)

Figure 10:
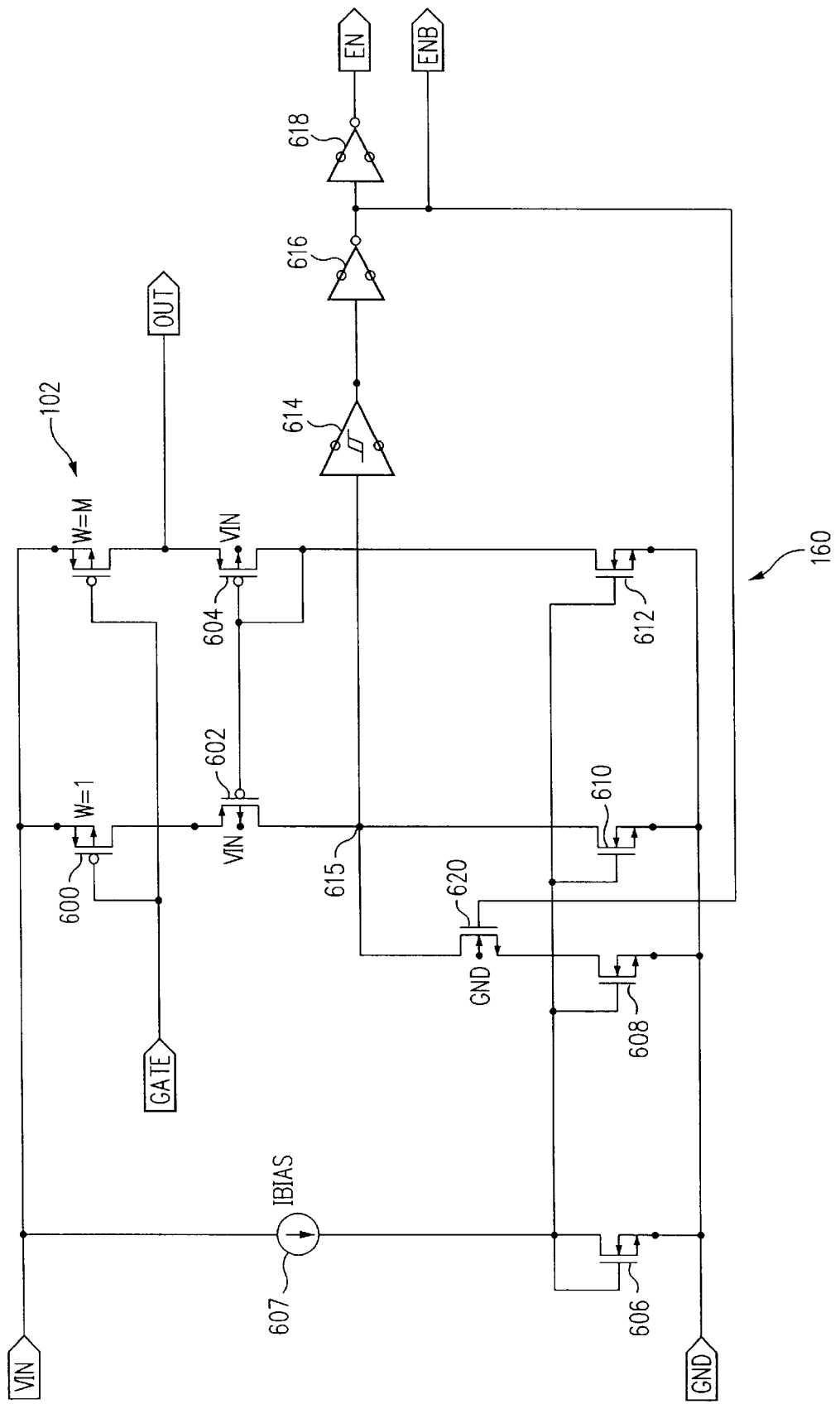
FIG. 10 is a schematic circuit diagram of a "crude" current-detection circuit that can be used to enable and disable a current-limited switch of this invention.

As mentioned above, current-detection circuit 160 detects when the current through the power MOSFET 160 is below a "crude" threshold and, to conserve power, disables amplifier 114 and the rest of the circuitry in current-limited switch. FIG. 10 shows a circuit that can be used for current-detection circuit 160. MOSFET 600 is much smaller than power MOSFET 102 (for example, by a factor of 250,000). The current Ibias flows through MOSFET 606 and is mirrored in MOSFETs 608, 610 and 612. MOSFET 602 steps downs the voltage at the drain of MOSFET 600 by one threshold drop and MOSFET 604 steps the voltage up again by a threshold drop, so that the voltages at the respective drains of MOSFETs 600 and 102 are approximately equal. Thus the current through MOSFET 600 mirrors the current through power MOSFET 102 but at a much reduced level.

The voltage at node 615 is determined by the relevant magnitudes of the currents through MOSFETs 600 and 610 (e.g., if the current through MOSFET 600 is greater than the current through MOSFET 610, the voltage at node 615 will increase). When the current through MOSFET 600 reaches a predetermined level, the voltage at node 615 causes Schmidt trigger 614 to deliver an output. The output of Schmidt trigger 614 is passed through inverter 616 and becomes the inverted ENABLE signal. The output of inverter 616 is passed through an inverter 618 and becomes the ENABLE signal. The ENABLE and inverted ENABLE signals are used to disable the difference amplifier 114 when the current through MOSFET 600 is below the predetermined level. Amplifier 114 (FIG. 9)is disabled by turning off Ibias, grounding the gates of MOSFETs 316, 318 and 320, and tying the gate of MOSFET 314 to Vin. The ENABLE signal can then be used to control the gate of power MOSFET 102, and place it in an on condition, by grounding its gate.

The foregoing embodiments are to be considered as illustrative and not limiting. Numerous alternative embodiments will be obvious to those skilled in the art. For example, while current-limited switches 100 and 200 are high-side switches (i.e., connected on the positive voltage side of the load 104), a current-limited switch in accordance with this invention can be fabricated as a low-side switch, using, for example, N-channel MOSFETs.

I claim:

1. A current-limited switch comprising:

a power MOSFET;

a pilot circuit connected in parallel with the power MOSFET, a first pilot MOSFET and a second pilot MOSFET being connected in the pilot circuit;

a reference circuit comprising a current source and current mirror circuitry, the current mirror circuitry comprising first and second parallel circuits, each parallel circuit comprising a first current mirror MOSFET connected in parallel with a second MOSFET, the first and second parallel circuits being connected in series;

a difference amplifier having a first input terminal coupled to a point in the pilot circuit and a second terminal coupled to a point in the reference circuit, and having an output terminal coupled to a gate of the power MOSFET; and a current mirror compensation circuit comprising:

a first bypass switch for forming a short around the first parallel circuit when a voltage at a terminal of the power MOSFET reaches a first level;

a second bypass switch for forming a short around the second parallel circuit when the voltage at the terminal of the power MOSFET reaches a second level; and a voltage-divider circuit, a first node of the voltage divider circuit being coupled to the first bypass switch, a second node of the voltage-divider circuit being coupled to the second bypass switch, wherein the voltage-divider circuit comprises a plurality of voltage-divider MOSFETs connected in series, the second node being located at a point between two of the voltage-divider MOSFETs.

2. The current-limited switch of claim 1 wherein a gate terminal and a drain terminal of each voltage-divider MOSFET are shorted together.

3. The current-limited switch of claim 2 wherein the voltage-divider circuit comprises a plurality circuit paths connected in parallel, the first node being located in a first one of the circuit paths and the second being located in a second one of the circuit paths.

4. The current-limited switch of claim 3 wherein the first one of the circuit paths contains N voltage-divider MOSFETs and the second one of the circuit paths contains N+1 voltage-divider MOSFETs.

5. The current-limited switch of claim 4 wherein a gate terminal and a drain terminal of each voltage-divider MOSFET are shorted together.

6. The current-limited switch of claim 5 wherein the output terminal of the difference amplifier is coupled to the gate terminal of the MOSFET in each parallel circuit.

7. The current-limited switch of claim 6 wherein the output terminal of the difference amplifier is coupled to a gate terminal of the pilot MOSFET.

* * * * *

UNITED STATES PATENT AND TRADEMARK OFFICE
CERTIFICATE OF CORRECTION

PATENT NO. : 6,320,365 B1
DATED : November 20, 2001
INVENTOR(S) : Kevin P. D'Angelo It is certified that error appears in the above-identified patent and that said Letters Patent is hereby corrected as shown below:

<u>Title page,</u>
Please add Item -- [73] Assignee: Advanced Analogic Technologies Incorporated --

Signed and Sealed this

Fifteenth Day of July, 2003

JAMES E. ROGAN
*Director of the United States Patent and Trademark Office*